United States Patent
Davidsen et al.

(10) Patent No.: US 9,705,017 B2
(45) Date of Patent: Jul. 11, 2017

(54) NANOSTRUCTURED SILICON BASED SOLAR CELLS AND METHODS TO PRODUCE NANOSTRUCTURED SILICON BASED SOLAR CELLS

(71) Applicant: Danmarks Tekniske Universitet, Kgs. Lyngby (DK)

(72) Inventors: Rasmus Schmidt Davidsen, Copenhagen (DK); Ole Hansen, Hørsholm (DK); Anja Boisen, Birkerød (DK); Michael Stenbæk Schmidt, Copenhagen (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 0 days.

(21) Appl. No.: 15/022,137

(22) PCT Filed: Sep. 26, 2014

(86) PCT No.: PCT/DK2014/050305
§ 371 (c)(1),
(2) Date: Mar. 15, 2016

(87) PCT Pub. No.: WO2015/043606
PCT Pub. Date: Apr. 2, 2015

(65) Prior Publication Data
US 2016/0240703 A1    Aug. 18, 2016

(30) Foreign Application Priority Data

Sep. 27, 2013  (DK) .................................. 2013 70535
Oct. 24, 2013  (EP) ..................................... 13190106

(51) Int. Cl.
*H01L 31/0236*    (2006.01)
*H01L 31/068*     (2012.01)
*H01L 31/18*      (2006.01)

(52) U.S. Cl.
CPC ...... *H01L 31/02363* (2013.01); *H01L 31/068* (2013.01); *H01L 31/1804* (2013.01);
(Continued)

(58) Field of Classification Search
CPC ........... H01L 31/02363; H01L 31/1868; H01L 31/186; H01L 31/068; H01L 31/1804; Y02E 10/547; Y02P 70/521
See application file for complete search history.

(56) References Cited

U.S. PATENT DOCUMENTS 6,091,021 A * 7/2000 Ruby ................ H01L 31/02167
136/255
8,148,194 B2    4/2012 Fujii et al.
(Continued)

FOREIGN PATENT DOCUMENTS

CN    101734611 A    6/2010
CN    102110724 A    6/2011
(Continued)

OTHER PUBLICATIONS

Füchsel, Kevin "Black silicon photovoltaics" Photonics for Solar Energy Systems IV, 2012, pp. 84380M-1-84380M-8, Proc. of SPIE vol. 8438.
(Continued)

*Primary Examiner* — Kyoung Lee
(74) *Attorney, Agent, or Firm* — Knobbe Martens Olson & Bear LLP

(57) ABSTRACT

The present invention relates to a plasma texturing method for silicon based solar cells and the nanostructured silicon solar cells produced thereof. The silicon based solar cell comprises a silicon substrate having in at least part of its surface conical shaped nanostructures having an average height between 200 and 450 nm and a pitch between 100 and
(Continued)

200 nm, thereby achieving low reflectance and minimizing surface charge recombination.

19 Claims, 5 Drawing Sheets

(52) U.S. Cl.
CPC ........ *H01L 31/186* (2013.01); *H01L 31/1868* (2013.01); *Y02E 10/547* (2013.01); *Y02P 70/521* (2015.11)

(56) References Cited

U.S. PATENT DOCUMENTS

| | | |
|---|---|---|
| 2002/0000244 A1 | 1/2002 | Zaidi |
| 2004/0040932 A1 | 3/2004 | Inomata et al. |
| 2009/0180188 A1 | 7/2009 | Bach et al. |
| 2009/0261353 A1 | 10/2009 | Gaebler et al. |
| 2010/0117108 A1 | 5/2010 | Gaebler et al. |
| 2012/0171804 A1* | 7/2012 | Moslehi ............... B23K 26/073 438/71 |
| 2012/0174960 A1 | 7/2012 | Hashigami et al. |
| 2013/0068297 A1 | 3/2013 | Xia et al. |

FOREIGN PATENT DOCUMENTS

| | | |
|---|---|---|
| JP | 2002-76404 A | 3/2002 |
| WO | WO 2008/037506 A1 | 4/2008 |
| WO | WO 2008/127807 A1 | 10/2008 |
| WO | WO 2011/047359 A2 | 4/2011 |
| WO | WO 2011/065648 A1 | 6/2011 |
| WO | WO 2011/140273 A2 | 11/2011 |
| WO | WO2012/061266 A2 | 5/2012 |

OTHER PUBLICATIONS

Liu, Yaoping et al., "Nanostructure Formation and Passivation of Large-Area Black Silicon for Solar Cell Applications" Small, 2012, pp. 1392-1397, vol. 8, No. 9.

Nguyen, K.N. et al., "Black Silicon With Sub-Percent Reflectivity: Influence of the 3D Texturization Geometry" Transducers '11, Jun. 5-9, 2011, pp. 354-357.

Oh, Jihun et al., "An 18.2%-efficient black-silicon solar cell achieved through control of carrier recombination in nanostructures" Nature Nanotechnology, Nov. 2012, pp. 743-748, vol. 7.

Repo, Päivikki et al., "Effective Passivation of Black Silicon Surfaces by Atomic Layer Deposition" IEEE Journal of Photovoltaics, Jan. 2013, pp. 1-6, vol. 3, Issue 1.

Ruby, D.S. et al., "Plasma-Texturization for Multicrystalline Silicon Solar Cells" 28$^{th}$ IEEE Photovoltaic Specialists Conference, Anchorage, Sep. 2000.

Yoo, Jinsu et al., "Reactive ion etching (RIE) technique for application in crystalline silicon solar cells" Solar Energy, 2010, pp. 730-734, vol. 84.

International Search Report for PCT/DK2014/050305 dated Feb. 9, 2015.

* cited by examiner (a) b-Si sample before Al₂O₃ deposition  (b) b-Si sample after Al₂O₃ deposition ns (US 9,705,017 B2)

NANOSTRUCTURED SILICON BASED SOLAR CELLS AND METHODS TO PRODUCE NANOSTRUCTURED SILICON BASED SOLAR CELLS

CROSS REFERENCE TO RELATED APPLICATIONS

This application is a U.S. National Phase Application of PCT International Application Number PCT/DK2014/050305, filed on Sep. 26, 2014, designating the United States of America and published in the English language, which is an International Application of and claims the benefit of priority to Danish Patent Application No. PA 2013 70535, filed on Sep. 27, 2013, and European Patent Application No. 13190106.8, filed on Oct. 24, 2013. The disclosures of the above-referenced applications are hereby expressly incorporated by reference in their entireties.

FIELD OF THE INVENTION

The present invention relates to a silicon based solar cell comprising nanostructures and a plasma texturing method for production of nanostructured silicon based solar cells.

BACKGROUND OF THE INVENTION

High reflectance is a source of loss of performance in solar cells. For example in multi-crystalline Si solar cells, high reflectance generally constitutes a ≈8% loss in performance due to optical loss.

Black Silicon (BS) nanostructuring allows to achieve low reflectance due to the resulting graded refractive index at the Si-air interface.

Metal-assisted wet etching black silicon process for texturing silicon surface and reactive ion etching (RIE) are known method for texturing silicon surface. RIE-texturing has so far not been proven superior to standard wet texturing, primarily as a result of lower power conversion efficiency due to increased surface recombination.

Hence, an improved silicon solar cell combining low reflectance and high performance would be advantageous.

Several studies on optical optimizations aiming at reducing high reflectance of surfaces are known. However, these studies have not been implemented into optimal nanostructures for applications in solar cells and solar cells production. Furthermore, optical optimizations aiming at reducing high reflectance of surfaces generally do not address issues related to diffuse light.

Thus, in particular an improved silicon solar cell showing low reflectance that is less dependent on the angle of incidence of the light, such as a more efficient silicon solar cell showing improved efficiency upon irradiation of diffuse light would be advantageous.

Moreover, production costs of solar cells related to optimizations in surface texturing are high.

Thus, an improved method of producing silicon based solar cell allowing to save material and production costs would also be advantageous.

OBJECT OF THE INVENTION

It is an object of the present invention to provide silicon solar cells with improved efficiency even upon irradiation by diffused light.

It may be seen also as an object of the present invention to provide a more efficient and low cost method of production of silicon based solar cell.

SUMMARY OF THE INVENTION

According to the invention a conically shaped structures with an average height between 200 to 450 nm and having a pitch between 100 and 200 nm has been shown to be the optimal geometry for a nanostructure on silicon surface that provides low reflectance and at the same time avoids or reduces charge surface recombination.

Thus, the above described object and several other objects are intended to be obtained in an aspect of the invention by providing a silicon based solar cell comprising a silicon substrate, wherein the silicon substrate has a surface and at least part of the surface comprises conical shaped nanostructures having an average height between 200 and 450 nm and a pitch between 100 and 200 nm. In the first aspect, the invention relates to a silicon based solar cell having at least part of its surface comprising a specific nanostructure topology that is optimized so as to achieve a low reflectance and at the same time minimize surface charge recombination.

The specific nanostructure topology provides a low reflectance of the incident light. At the same time the specific nanostructure topology of the invention optimizes the photovoltaic performance of the solar cell, e.g. provides a reflectance lower than 2%, such as lower than 1% and a high power conversion efficiency, i.e. in the area of 16.5%.

The silicon based solar cell having these specific nanostructures is optimized for operation under non-ideal conditions, e.g. having a low reflectance that is less dependent on the angle of incidence of the light, i.e. in turn achieving high efficiency also at diffuse light and at non-ideal incident angles representing actual, non-ideal operating conditions of solar cells and panels.

Thus besides achieving a lower reflectance at normal incidence of the light compared to industrial standard cells, the nanostructured surface also has the advantage of lower reflectance and even lower increase in reflectance at non-ideal incident angles. When the relative angle between the sunlight and the solar cell changes—which is a very relevant phenomenon, since the angle changes during the day and during the year at a certain location on Earth—the reflectance of the RIE-textured cell increases less than the standard textured solar cells. In turn, the solar cell absorbs more light and potentially becomes more efficient.

The geometry of the nanostructures and thus topology of the silicon based solar cell surface is optimized with respect to solar cell performance, which, in this case is a compromise between optimal light absorption and optimal electrical properties, more specifically optimal photocurrent and open-circuit voltage. Pitch or period is defined as the distance between the centres of the conical structures, i.e. the distance between the conical tips of the conical structures. Height is defined as the distance between the surface of the silicon substrate and the tip of the conical structures.

The conical shaped nanostructures have a circular perimeter, a sharp tip and a broader base.

In some embodiments, the base of each conically shaped structure may be in the area of 100 nm. The width of the conically shaped structures may decrease from base to top ending in a top width that is significantly smaller than the base, for example down to just a few nm, such as between 1 and 20 nm.

In some embodiments, the conical nanostructures have an average density of 75-200 $\mu m^{-2}$.

In some embodiments the at least part of the surface comprising conical shaped nanostructures has an area larger than 150 cm$^2$.

The nanostructure may be arranged randomly on the surface. However, in some embodiments the nanostructures may be arranged following a specific order, e.g. in lines.

The advantage of such a nanostructured topology applied as surface texturing for solar cells is that this surface yields extremely low reflectance of light in the relevant solar spectrum, i.e. $\lambda$ between 300 nm and 1200 nm, thus high absorption of sunlight assuming negligible transmission of light through the solar cell. The weighted, average reflectance of such nanostructured surfaces is below 1%, which is lower than the reflectance of conventionally textured solar cells having weighted average reflectance of ≈2% for mono-crystalline silicon and ≈8% for multi-crystalline silicon with silicon nitride anti-reflective coating covering the surface in the case of conventional texturing. The described nanostructures achieve reflectance below 1% without anti-reflective coating. Anti-reflective coating may still be used in order to improve light absorption further. Furthermore, the nanostructure topology according to some aspect of the invention has the advantage of being applicable to different crystalline grades of silicon such as mono-, multi and quasi-mono crystalline silicon.

Indeed, in some embodiments the silicon based solar cell comprises multicrystalline silicon.

In some other embodiments, the silicon based solar cell comprises quasi-monocrystalline silicon.

In some further embodiments, the multi-crystalline silicon solar cell substrate comprises 60-90% of mono-crystalline silicon. In some examples, the multi-crystalline silicon substrate contains more than 90% of mono-crystalline silicon.

In some other examples, the multi-crystalline silicon substrate contains less than 60% of mono-crystalline silicon.

In some other embodiments, a stack of silicon based solar cells according to first aspect of the invention is provided.

In some embodiments, the silicon based solar cell further comprises a passivation layer.

Passivation refers to a material becoming "passive," that is, being less affected by external factors. A passivation layer is herein defined as a layer, i.e. a light coat of material, creating a shell around the conical nanostructure and thus reducing the probability of charge surface recombination.

According to some embodiments, the invention discloses the combination of the nanostructure topology together with a deposited thin film of one material or a combination of materials in order to passivate the nanostructured surface. Surface recombination of the charge carriers is known to reduce solar cell performance. The presence of a passivation layer reduces charge surface recombination and in turn increases the solar cell efficiency.

For example, the passivation layer may comprise a metal oxide.

In some embodiments, the passivation layer comprises $Al_2O_3$, $SiO_2$, $TiO_2$ or metal nitride, such as $Si_3N_4$.

For example, the passivation layer may comprise $Al_2O_3$ in combination with $Si_3N_4$ and/or $SiO_2$ in a stack with $Al_2O_3$ or in direct contact with the nanostructured Si surface. The $Al_2O_3$ layer may have a thickness of 5-30 nm while the $Si_3N_4$ located on top of the alumina layer may have a thickness of between 50 and 100 nm.

The passivation layer may be deposited by means of atomic layer deposition (ALD), sputtering or plasma-enhanced chemical vapour deposition (PECVD). For example, the $Al_2O_3$ layer may be deposited using either ALD or PECVD. The $Si_3N_4$ layer may be deposited using PECVD or other known method of coating. The increase of the surface area, due to the presence of nanostructures, allows for the production of Si based solar cells having relatively high efficiency, which are significantly thinner than the industrial standard, i.e. in the area of 200 µm. This has the further advantage of saving material costs.

In some embodiments, the silicon based solar cell has a total cell thickness below 180 µm.

In some further embodiments, the total cell thickness of the silicon based solar cell according to some aspects of the invention is between 0.1 and 70 µm, such as between 10 and 50 µm.

In some embodiments, the silicon based solar cell comprises a rear side surface, wherein the rear side surface comprises structures produced by the method according to some aspects of the invention.

The described object and several other objects are also intended to be obtained in a second aspect of the invention by providing a method of producing conical shaped nanostructure having a height between 200 and 450 nm and a pitch between 100 and 200 nm on a silicon substrate by means of maskless RIE. RIE is a dry etching technique that uses chemically reactive plasma to remove material deposited on surface, e.g. on a silicon wafer.

RIE may comprise several steps and use different working gases, such as $SF_6$ and $O_2$. One of the advantages of RIE is that it is a maskless process, which means that the surface texturing of the solar cells takes place in a single, maskless step. One of the advantages of the method of the invention is the use of room temperature, i.e. 20° C., which reduces the expenses due to the production process as compared to cryogenic (ICP) RIE that uses temperature in the area of 120° C. Room temperature RIE has also the advantage of reducing processes expenses as it employs only one power source and not two power sources as ICP RIE.

A further advantage of the method according to one aspect of the invention is that, on the contrary from conventional texturing, this method can be applied to all kinds of silicon surfaces regardless of crystallinity. Furthermore, compared to conventional wet texturing, such as KOH or HF/HNO$_3$, RIE-texturing has the advantage of being a dry texturing process consuming relatively small amounts of gases compared to the consumed amount of chemicals in wet texturing, thus reducing chemical and water consumption in the cell production significantly. Typically different methods have to be used for different substrates, e.g. y KOH-etching for mono-crystalline and acidic (HF, $HNO_3$) etching for multi-crystalline Si. In some embodiments a chemical post-treatment of the nanostructured surface, e.g. with $HNO_3$/HF, KOH, Tetramethylammonium hydroxide (TMAH), or similar chemicals, may be introduced.

The described object and several other objects are also intended to be obtained in a third aspect of the invention by providing a method of producing a silicon based solar cell according to the first aspect of the invention comprising: emitter doping, metal contact deposition and the method according to the second aspect of the invention.

In some embodiments of the method according to the third aspect of the invention, the method according to the second aspect of the invention is applied before the emitter doping and the metal contact deposition.

In some embodiments, the metal contact deposition may occur by screen-printing. In other embodiments, the metal contact deposition may occur by plating, electro-plating, sputtering, evaporation, inkjet-printing or a combination of two or more of these and/or screen-printing.

In some embodiments, the metal forming front contacts may be a stack of metals, e.g. Ni and Cu.

Specifically Ni may be evaporated or sputtered and Cu may be plated or electroplated.

In some embodiments of the method according to the third aspect of the invention, the method according to the second aspect of the invention is applied after the emitter doping and the metal contact deposition.

In some embodiments of the method according to the third aspect of the invention, the method according to the second aspect of the invention is applied after the emitter doping and before the metal contact deposition.

In a forth aspect a selective solar emitter solar cell is produced by the method according to third aspect of the invention.

The fundamental structure of silicon solar cells is based on two stacked, positively and negatively doped areas, i.e. the p-n junction. The charge carriers generated by the photo effect are separated by this p-n junction and conducted externally via metal contacts on both sides. In conventional solar cells using homogenous emitters, emitter doping always results in a compromise. High n-doping is required in the emitter layer to minimize the resistivity between semiconductor and metal contacts. However, recombination losses increase with rising of n-doping concentration that has an adverse impact on power generation.

A selective solar emitter solar cell comprising a negatively doped area and a metal contact, wherein the n-doping of the negatively doped area is higher in a part in contact with said metal contact than in a part not contact with said metal contact. Through the method according to some aspect of the invention, the n-doping in the emitter can be partially varied with precision. While the narrow area on the front side metal contacts has a high n-doping concentration and therefore a low emitter resistivity, the remaining surface has been exposed to lower n-doping, so that a larger part of the cell can be used for the production of electricity. As a result, a boost in solar cell performance is combined with excellent ohmic contact By selectively decreasing emitter sheet resistance only under the front metal contacts and increasing emitter sheet resistance elsewhere, one can simultaneously minimize contact-related resistive losses and maximize photocurrent generation.

Thus, in a fifth aspect a method of adjusting the doping level in a selective emitter solar cell is provided.

The method according to the fifth aspect of the invention allows to selectively reduce the n-doping in a select area of the n-doped silicon layer, thus allowing to have an optimal n-doping in the area in contact with the metal contact, i.e. lower sheet resistance, while at the same time have an optimal n-doping in areas not in contact with the metal contact, i.e. so that a larger part of the cell can be used for the production of electricity. Specifically, the described method of RIE used as front surface texturing—after emitter doping and metal deposition—simultaneously creates a selective emitter by etching the emitter everywhere but under the metal contacts (denoted 'etch-back'), thus increasing sheet resistance significantly everywhere but below the metal contacts. This is an advantageous approach to the formation of a selective emitter, since it does not require any additional process steps. Sheet resistance will be <10 Ohm/sq. under the contacts and in the range of 40-200 Ohm/sq. elsewhere.

Thus in one aspect of the invention a method of changing the sheet resistance is provided. The method adjusts the doping level in a selective emitter solar cell by producing conical shaped nanostructure having a height between 200 and 450 nm and a pitch between 100 and 200 nm on a silicon substrate by means of maskless RIE. The method is simultaneously applied as texturing and etch-back of the emitter, so that sheet resistance under the metal contacts is reduced within the range of 1-20 Ohm/sq. and sheet resistance of the reactive ion etched surface elsewhere is in the range of 40-200 Ohm/sq.

In some embodiments the method according to the second aspect of the invention has the function of texturing and etch-back of the emitter, thereby adjusting the doping level in a selective emitter solar cell and changing the sheet resistance of the emitter such that sheet resistance under the metal contacts is in the range of 1-20 Ohm/sq. and sheet resistance of the reactive ion etched surface elsewhere is in the range of 40-200 Ohm/sq.

In some further embodiments, a selective emitter solar cell produced by the method according to the second aspect of the invention comprises front metal contacts, wherein the front metal contacts comprise Ag and wherein the deposition method is screen-printing.

In some other embodiments, the front metal contacts comprise Ni or Cu in a stack and the deposition method is evaporation, sputtering, inkjet-printing, plating or electroplating.

In some embodiments, the metal contact deposition is applied to the selective emitter solar cell and comprises deposition of Ni, Cu and Ag or Sn in a stack and wherein the deposition method is evaporation, sputtering, inkjet-printing, plating, such as electroplating, electroless plating or light-induced plating.

In a further aspect the invention relates also to a method of producing silicon based solar cell by employing a technique of reactive ion etching (RIE) at room temperature which allows for an optimized sequence of the steps required by the industrial production of silicon solar cells, thereby allowing to save material and production costs.

In some embodiments of the method according to the third aspect of the invention, the step of emitter doping comprises laser doping.

Laser doping may comprise exposing the silicon solar cell to light beam with a wavelength in the range of 300-1100 nm. For example, the laser doping may comprise exposing the silicon solar cell to light beam with a wavelength of 532 nm.

In some embodiments the laser doping is performed by a pulsed laser and wherein laser pulses have pulse lengths in the range between 1 s and 1 ps ($10^{-12}$ s), such as between 1 µs ($10^{-6}$ s) and 100 ns ($10^{-9}$ s). For example the laser pulses may have pulse lengths in the range between 1 µs ($10^{-6}$ s) and 1 ps ($10^{-12}$ s).

In some embodiments, the laser doping is performed by a pulsed laser and wherein laser pulses have pulse frequency in the range between 1 KHz and 100 MHz, such as between 100 KHz and 200 KHz.

In some other embodiments, the laser doping is performed by a continuous wave laser.

In some other embodiments of the method according to the third aspect of the invention further comprises: passivating the silicon based solar cell by depositing a single layer or a stack of layers of dielectric materials.

The passivation may occur prior to the laser doping.

In some embodiments, the step of depositing the single layer or the stack of layers of dielectric materials comprises depositing $Al_2O_3$ by means of atomic layer deposition (ALD).

The step of depositing the single layer or the stack of layers of dielectric materials may further comprise depositing SiN$_x$:H deposited by means of plasma enhanced chemical vapour deposition (PECVD).

The step of depositing of the single layer or the stack of layers of dielectric materials comprises depositing a layer of Al$_2$O$_3$ having a thickness in the range of 5-50 nm, such as between 5-30 nm.

An advantage of the method according to the third aspect of the invention is that it can be applied efficiently to P-type doping of n-type silicon substrates.

For example, following the deposition of the passivating Al$_2$O$_3$ layer, aluminium atoms may be released by exposing the passivated surface to a laser beam, thus doping the area exposed.

In other words, aluminium atoms from the Al$_2$O$_3$ layer are used as p-type dopants forming highly doped areas of sheet resistance 1-20 Ohm/sq. as a result of the laser doping process applied to the passivated silicon surface.

Thus, the use of an ALD Al$_2$O$_3$ layer has the double advantage of providing an extremely good passivation of the silicon surface with confirmed lifetimes of several hundreds μsec and of allowing for effective Al-doping. Effective Al-doping is achieved during the laser doping that causes localized melting and/or ablation of the passivating layer and thus diffusion of the Al into the bulk of the molten silicon underneath the passivating layer.

P-type emitter doping may be also achieved by diffusion of other elements. For example, P-type emitter doping may be achieved by boron diffusion resulting in an emitter having sheet resistance in the range of 90-200 Ohm/sq. and/or the silicon surface having a boron concentration below $10^{20}$ cm$^{-3}$.

The resulting boron-silicate-glass from the boron diffusion is not removed and the boron atoms from the boron-silicate-glass are used as p-type dopants due to the exposure to laser beam.

Additional dopant sources may be used. For example doping may be also achieved by means of spin-on doping of compounds containing elements, such as phosphorus and/or boron prior to the laser doping.

In some embodiments, the metal contact deposition is applied after the laser doping. The metal contact deposition may occurs onto areas of silicon exposed to the laser doping. The metal contact deposition may comprise depositions of Ni, Cu and Ag or Sn in a stack and wherein the metal contact deposition is by electroless plating, electroplating or light-induced plating.

The overlayer of Ag or Sn may have the function of a capping layer.

In some embodiments, the step of passivating further comprises depositing a semiconducting layer.

For example, the depositing of the single layer or the stack of layers of dielectric materials comprises depositing a layer of SiO$_2$ and depositing the semiconducting layer comprises depositing amorphous silicon or polysilicon.

In some embodiments, the depositing of the layer of SiO$_2$ comprises depositing a layer of SiO$_2$ having a thickness of 0.8-2 nm by means of wet chemical oxidation in nitric acid at a temperature in the range of 20-130° C. or thermal oxidation in oxygen or water ambient at a temperature in the range of 800-1200° C.

In some other embodiments, the depositing of the semiconducting layer comprises depositing a layer amorphous silicon or polysilicon having a thickness of 5-100 nm by means of low pressure chemical vapour deposition (LP-CVD) using SiH$_4$, B$_2$H$_6$, BCl$_3$ and/or PH$_3$ at a temperature in the range of 500-700° C. or by means of PECVD using SiH$_4$, Ar, B$_2$H$_6$, BCl$_3$ and/or PH$_3$ at a temperature of 200-400° C.

In some embodiments, the laser doping and the metal deposition occur after the passivating step.

In some embodiments, the silicon based solar cell is quasi-mono-crystalline silicon containing 60-99% mono-crystalline silicon based solar cell.

The first, second and other aspects and embodiments of the present invention may each be combined with any of the other aspects and embodiments. These and other aspects of the invention will be apparent from and elucidated with reference to the embodiments described hereinafter.

BRIEF DESCRIPTION OF THE FIGURES

The silicon solar cell and the method according to some aspect the invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Several batches of commercial size and grade silicon solar cells have been fabricated with the nanostructure topology of the invention, and characterized in terms of optical and photovoltaic performance, showing excellent light absorption (<2%, such as lower than 1% reflectance) and high power conversion efficiency, i.e. in the area of 16.5% efficiency. The improved optical performance at non-ideal incident angles has been confirmed by reflectance measurements.

A simple mask-less, scalable RIE nanostructuring of the solar cell surface, according to some embodiments of the invention, is shown to reduce the AM1.5-weighted average reflectance to a level below 1% in a fully optimized RIE texturing, and thus holds a significant potential for improvement of the cell performance compared to current industrial standards. The reflectance is shown to remain below that of conventional textured cells also at high angle of incidence. The production process was successfully integrated in fabrication of solar cells using only industry standard processes on a Czochralski (CZ) silicon starting material. The process is shown to be equally applicable to mono-, multi- and quasi-mono-crystalline Si. The resulting cell performance was compared to cells with conventional texturing showing improved performance.

The data show that the RIE nanostructures lead to superior light absorption independent of crystalline grade and incident angle.

The nanostructures were fabricated as the texturing step in the following solar cell process: 1) Saw damage removal, 2) Texturing using maskless RIE in a $O_2$ and $SF_6$ plasma 3) Emitter formation using a $POCl_3$ doping process, followed by PSG-removal in 5% buffered HF, 4) Deposition of SiNx:H anti-reflective coating using PECVD with $SiH_4$, $NH_3$ and $N_2$, 5) Screen-printing of front and rear, 6) Edge isolation using laser ablation.

The starting substrates were 156×156 mm p-type, CZ mono-c Si wafers with a thickness of 200 μm and a resistivity of 1-20 Ωcm.

Reflectance measurements of the RIE-textured mono-, multi and quasi-mono Si surfaces were performed using a broadband light source (Mikropack DH-2000), an integrating sphere (Mikropack ISP-30-6-R), and a spectrometer (Ocean Optics QE65000, 280-1000 nm). The reference solar spectral irradiance for AM 1.5 was used to calculate the weighted average reflectance in the wavelength range from 280-1000 nm.

I-V curves on complete cells were measured under 1 Sun illumination (1000 W/m$^2$) using a xenon light bulb.

Figure 1:
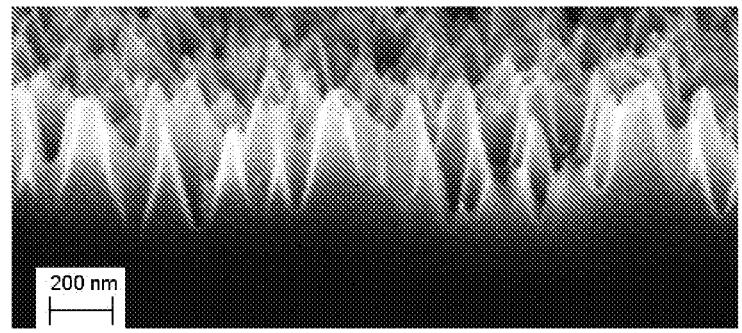
FIG. 1 shows a Scanning Electron Microscopy (SEM) image of a nanostructured surface topology according to some embodiments of the invention.

FIG. 1 shows SEM-image at 45° tilt of the black silicon surface after RIE-texturing. The nanostructures are h≈3-400 nm tall and the area density is D 100 μm$^{-2}$.

Figure 2:
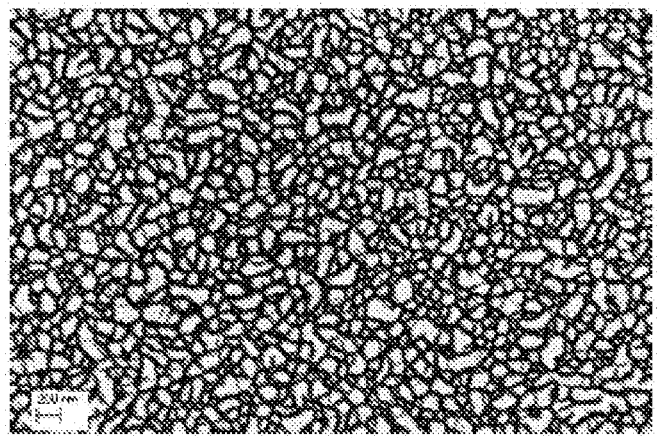
FIG. 2 shows a SEM image top-view of a nanostructured surface topology according to some embodiments of the invention.

FIG. 2: SEM-image top-view of a similar nanostructured Si surface. The density of peaks is 50-100 μm$^{-2}$ and typically falls within the range of 75-200 μm$^{-2}$.

Figure 3:
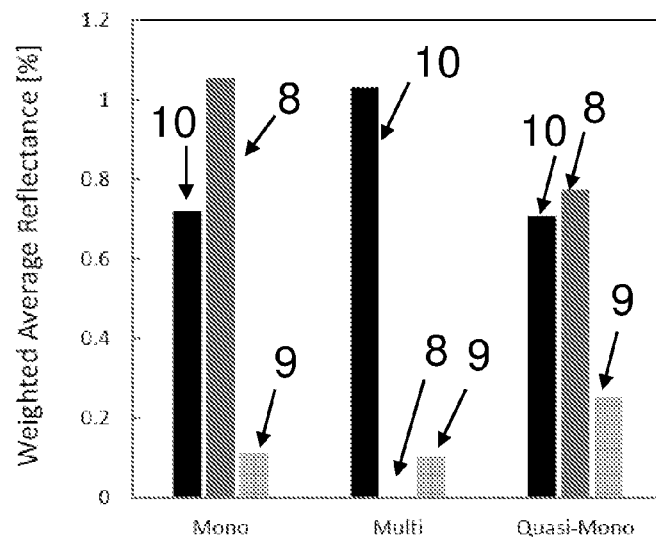
FIG. 3 is a graphical representation of the weighted average and minimum reflectance of light of nanostructured surfaces fabricated by RIE according to some embodiments of the invention.

FIG. 3 shows weighted (AM1.5) average reflectance before 10 and after 8 emitter diffusion as well as the minimum reflectance 9 of mono-, multi- and quasi-mono Si surfaces, respectively.

FIG. 3 shows average reflectance 10 of RIE-textured Si below 1% for all three crystalline grades of Si. This is a clear improvement compared to KOH- and acidic-textured Si used in standard industrial Si solar cells. The results furthermore show negligible increase in reflectance after emitter diffusion. The RIE-textured Si show near-zero minimum reflectance independent of crystalline grade.

Figure 4:
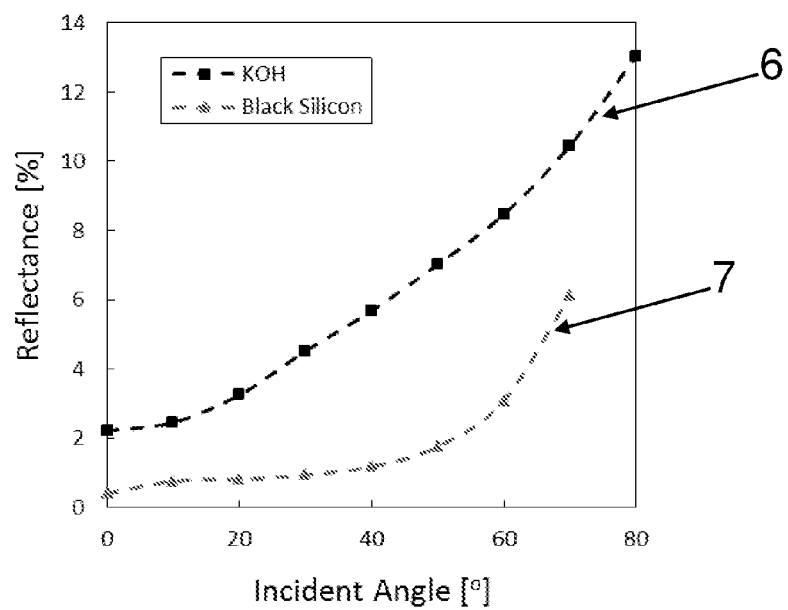
FIG. 4 shows the total weighted (AM1.5) average reflectance as a function of incident angle for a standard, KOH-textured 6 and RIE-textured 7 mono-c Si substrates according to some embodiments of the invention.

FIG. 4 shows the total weighted (AM1.5) average reflectance as function of incident angle for a standard, KOH-textured 6 and RIE-textured 7 mono-c Si substrates. The reflectance was measured using an integrating sphere with one axis angle variation of the incident optical fiber relative to the Si substrate. The reflectance of the RIE-cell shows to be independent of incident angle up to ≈40 degrees.

The improved optical performance at non-ideal incident angles is not only important with respect to the varying angle through the hours of the day and days of the year. In a real-life application, the available sunlight is typically diffuse due to clouds, particles in the air etc. Thus, the diffuse light response, i.e. the response to light within a certain range of non-normal incident angles, e.g. between 30 and 60° is very relevant.

FIG. 4 shows that the reflectance of KOH-textured Si increases more with incident angle up to 50° than the reflectance of RIE-textured Si. For angles above 50° the reflectance of RIE-textured Si increases more with incident angle than KOH-textured Si. The reflectance of RIE-textured Si is significantly lower than KOH-textured Si for incident angles of 0-80°. This result shows the potential of improved solar cell performance using RIE-texturing at non-ideal incident angles.

Figure 5:
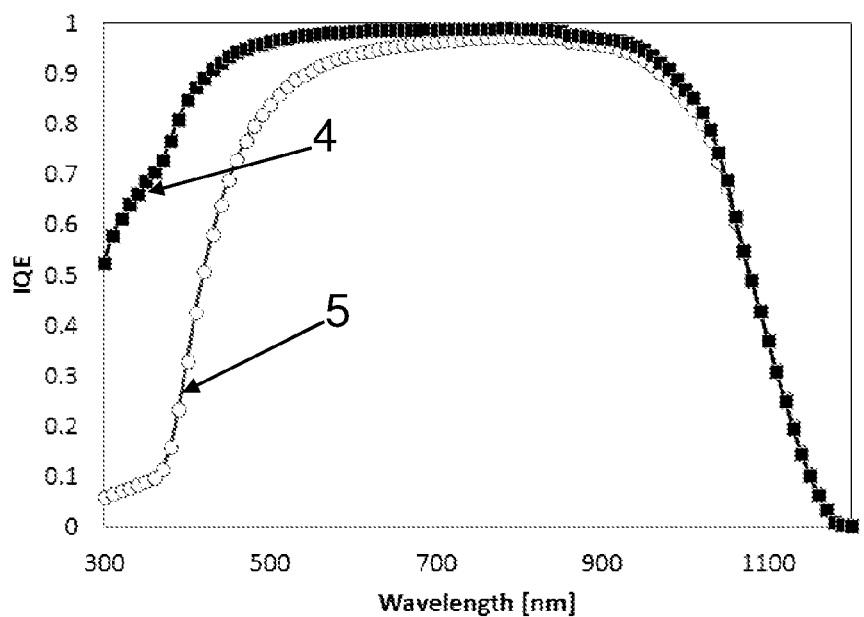
FIG. 5 shows the Internal Quantum Efficiency (IQE) of a black Si cell and a KOH-textured reference cells.

FIG. 5 shows the IQE of a black Si cell 5 and a KOH-textured reference cell 4. FIG. 5 shows that the IQE of the RIE-textured solar cell 5 is lower than the IQE of the KOH-textured reference cell 4—especially at wavelengths below 600 nm. It is assumed that the decreased IQE of the black Si cell 5 compared to the KOH-cell 4 at wavelengths below 600 nm indicates increased surface recombination, since light with shorter wavelength is absorbed closer to the surface. In order to confirm this, a LASSIE tool was used to evaluate the loss of current density of the differently textured solar cells. The result of this analysis is seen in Table 1.

TABLE 1

|  | Total Carrier Loss | Emitter recombination | Bulk recombination | Rear recombination |
|---|---|---|---|---|
| KOH | 1.385 mA/cm$^2$ | 0.761 mA/cm$^2$ | 0.207 mA/cm$^2$ | 0.192 mA/cm$^2$ |
| RIE | 4.163 mA/cm$^2$ | 3.322 mA/cm$^2$ | 0.267 mA/cm$^2$ | 0.069 mA/cm$^2$ |

Table 1 shows the calculated total carrier loss and carrier loss due to emitter, bulk and rear surface recombination for the KOH- and RIE-textured cell.

The assumption that emitter recombination is the primary explanation behind the lower IQE for the RIE-textured cells compared to the KOH-textured is confirmed by the calculated carrier losses in Table 1, since the emitter recombination is the dominant carrier loss mechanism of the RIE-textured cells.

TABLE 2

|  | PCE [%] | $J_{SC}$ [mA/cm$^2$] | $V_{OC}$ [V] | FF | $R_{av}$ [%] |
|---|---|---|---|---|---|
| KOH | 17.6 | 36.8 | 0.62 | 77.8 | 2-3 |
| RIE, type 1 | 15.7 | 35.3 | 0.61 | 72.8 | 2.85 |
| RIE, type 2 | 16.5 | 35.2 | 0.61 | 77.7 | 2.20 |

Table 2 shows the PV performance results including power conversion efficiency, PCE, short-circuit current, Jsc, open-circuit voltage, Voc, fill factor, FF and weighted average reflectance after emitter diffusion, Ray, of the RIE- and KOH-textured cells.

Table 2 shows that the RIE-textured cells have lower PCE than the KOH-cell due to lower $J_{SC}$. The current loss is explained by the increased emitter recombination shown in Table 1. This may be solved by introducing a passivation layer. Examples of cells having a reflectance lower than 1% and achieving reflectance lower than 1% can be produced according to some aspects of the invention.

Figure 6:
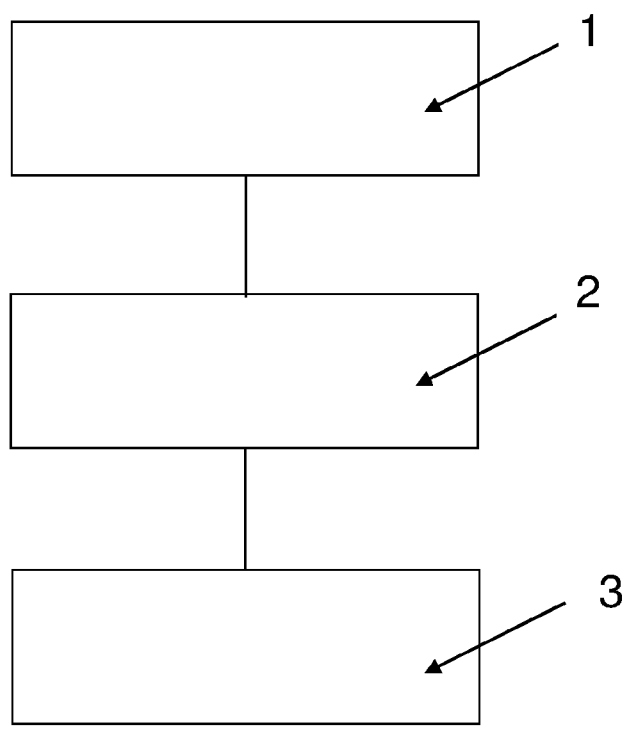
FIG. 6 is a flow-chart of a method according to some embodiments of the invention.

FIG. 6 is a flow-chart of a method according to some embodiments of the invention.

The method of producing a silicon based solar cell according to the first aspect of the invention comprising: 1 emitter doping, 2 metal contact deposition and 3 maskless RIE producing conical shaped nanostructure having a height between 200 and 450 nm and a pitch between 100 and 200 nm.

Example of Specification of RIE process parameters:
Room temperature; 25° C.+/−10 degrees
Gas flow ratio between $SF_6$ and $O_2$=0.5-2
using only one power source.

Some examples of sheet resistance resulting from emitter doping:
- 40-200 Ohm/sq. in case of conventional emitter (RIE before doping);
- <10 Ohm/sq. before RIE in case of selective emitter, resulting in 40-200 Ohm/sq. in non-contact areas after RIE;
- <10 Ohm/sq. in case of RIE after doping, resulting in 40-200 Ohm/sq. after RIE.

Figures 7A, 7B:
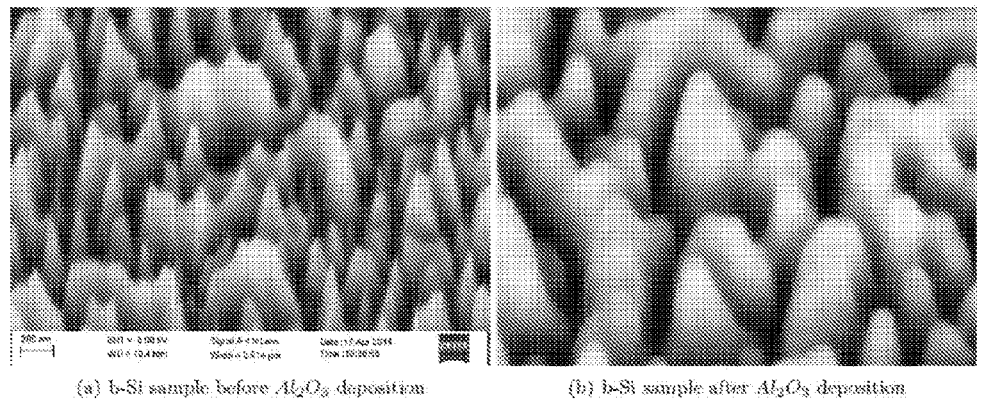
FIG. 7a shows a SEM image of a nanostructured surface topology produced by RIE before Atomic Layer Deposition (ALD) of Al$_2$O$_3$ according to some embodiments of the invention.
FIG. 7b shows a SEM image of a nanostructured surface topology produced by RIE after ALD of Al$_2$O$_3$ having a thickness of 30 nm according to some embodiments of the invention.

FIG. 7a shows a SEM image of a nanostructured surface topology produced by RIE before Atomic Layer Deposition (ALD) of $Al_2O_3$ according to some embodiments of the invention.

FIG. 7b shows a SEM image of a nanostructured surface topology produced by RIE after ALD of $Al_2O_3$ having a thickness of 30 nm according to some embodiments of the invention.

Figure 8:
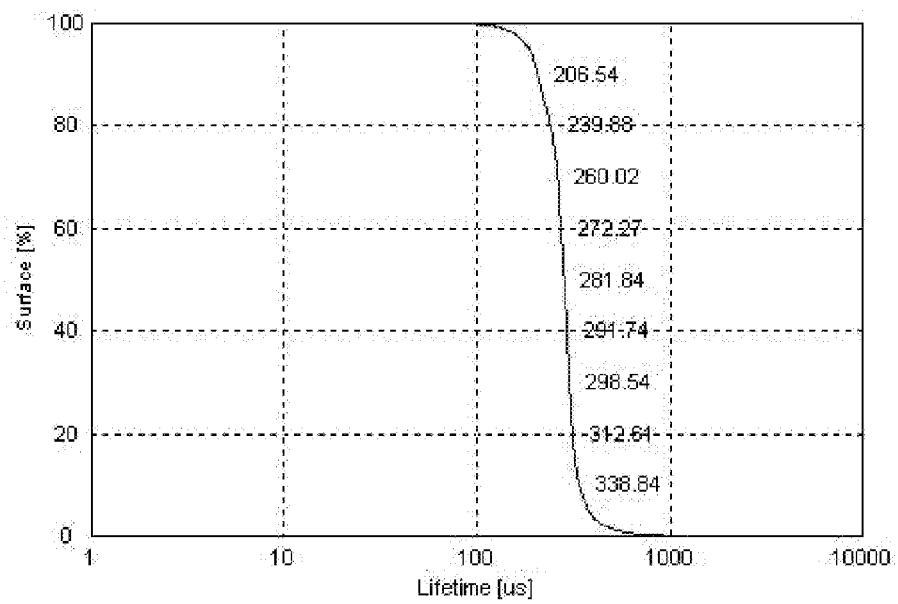
FIG. 8 shows surface recombination velocity (SRV) of RIE-textured Cz silicon with ALD Al$_2$O$_3$.

FIG. 8 shows surface recombination velocity (SRV) of RIE-textured Cz silicon with ALD $Al_2O_3$.

The percentages values show how large a part of the total surface with SRV equal to or lower than the value. Values of SRV down to 88 cm/s have been obtained.

Thus, as shown by the very low value of SRV, the use of ALD $Al_2O_3$. on the nanostructured silicon substrate according to some embodiments of the invention provides an extremely good surface passivation.

TABLE 3

| Surface Recombination Velocity [cm/s] | | |
|---|---|---|
| 30 nm ALD $Al_2O_3$ | 3 nm Thermal $SiO_2$ | 65 nm PECVD $SiN_x$:H |
| 110-190 | 610-1010 | 960-1320 |

Table 3 shows surface recombination velocity (SRV) of RIE-textured Cz silicon with ALD $Al_2O_3$, thermal $SiO_2$ and PECVD SiNx:H and, respectively.

It can be clearly seen that 30 nm ALD $Al_2O_3$ provides the best passivation onto the nanostructured silicon substrate according to some embodiments of the invention as achieving the lowest surface recombination velocity.

Figure 9:
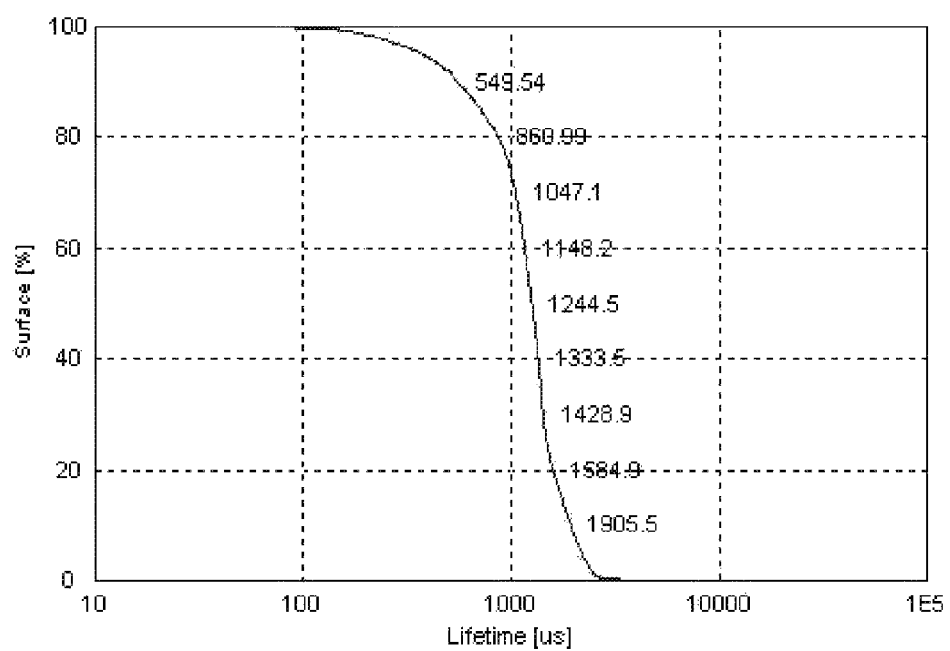
FIG. 9 shows minority carrier lifetime of RIE-textured p-type Cz silicon with passivated with SiO$_2$ and n-type poly-Si according to some embodiments of the invention.

FIG. 9 shows minority carrier lifetime of RIE-textured p-type Cz silicon with passivated with 1.4 nm $SiO_2$ and 15-40 nm n-type poly-Si.

Passivation of the nanostructured silicon substrate according to some embodiments of the invention can be achieved by a combination of tunnel-oxide and poly-Si passivation.

This passivation is achieved by firstly cleaning a p- and n-type Cz Si starting wafers, for example by RCA-cleaned. This can be performed on Si substrate with or without RIE-nanostructure texturing.

Secondly the oxide can be grown on the substrate, e.g. in 68% $HNO_3$ at 90-100° C. for 10 min leading to a measured thickness between 1.3 and 1.5 nm.

Thirdly phosphorus-doped amorphous Si may be deposited on top of the oxide, e.g. in LPCVD at 580° C. using $SiH_4$ and $PH_3$.

Finally a-Si may be annealed, thus becoming poly-Si, e.g. at 800° C. for 1 hour.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of producing a silicon based solar cell comprising a silicon substrate, said silicon substrate having a surface wherein at least part of said surface comprises conical shaped nanostructures having an average height between 200 and 450 nm and a pitch between 100 and 200 nm, said method comprising: emitter doping, metal contact deposition and producing conical shaped nanostructure having a height between 200 and 450 nm and a pitch between 100 and 200 nm on said silicon based solar cell by maskless reactive ion etching (RIE),
wherein said emitter doping comprises laser doping;
wherein said metal contact deposition is applied after said laser doping and, wherein said metal contact deposition occurs onto areas of silicon exposed to said laser doping.

2. The method according to claim 1 wherein said producing conical shaped nanostructure occurs before said emitter doping and said metal contact deposition.

3. The method according to claim 1, wherein said laser doping comprises exposing said silicon solar cell to a light beam with a wavelength in the range of 300-1100 nm.

4. The method according to claim 1, wherein said laser doping comprises exposing said silicon solar cell to a light beam with a wavelength of 532 nm.

5. The method according to claim 1, wherein said laser doping is performed by a pulsed laser and, wherein laser pulses have pulse lengths in the range between 1 s and 1 ps ($10^{-12}$ s), or between 1 μs ($10^{-6}$ s) and 100 ns ($10^{-9}$ s).

6. The method according to claim 1, wherein said laser doping is performed by a pulsed laser and, wherein laser pulses have pulse frequency in the range between 1 KHz and 100 MHz, or 100 KHz and 200 KHz.

7. The method according to claim 1, wherein said laser doping is performed by a continuous wave laser.

8. The method according to claim 1, further comprising: passivating said silicon based solar cell by depositing a single layer or a stack of layers of dielectric materials.

9. The method according to claim 8, wherein said passivating occurs prior to said laser doping.

10. The method according to claim 8, wherein depositing said single layer or said stack of layers of dielectric materials comprises depositing $Al_2O_3$ atomic layer deposition (ALD).

11. The method according to claim 8, wherein depositing said single layer or said stack of layers of dielectric materials further comprises depositing $SiN_x$:H deposited by plasma enhanced chemical vapour deposition (PECVD).

12. The method according to claim 8, wherein said depositing of said single layer or said stack of layers of dielectric materials comprises depositing a layer of $Al_2O_3$ having a thickness in the range of 5-50 nm, or 5-30 nm.

13. The method according to claim 1, wherein said metal contact deposition comprises depositions of Ni, Cu and Ag or Sn in a stack and, wherein said metal contact deposition is by electroless/galvanic plating, electroplating or light-induced plating.

14. The method according to claim 8, wherein said passivating further comprises depositing a semiconducting layer.

15. The method according to claim 14, wherein said depositing of said single layer or said stack of layers of dielectric materials comprises depositing a layer of $SiO_2$ and depositing said semiconducting layer comprises depositing amorphous silicon or polysilicon.

16. The method according to claim 14, wherein said depositing of said layer of $SiO_2$ comprises depositing a layer of $SiO_2$ having a thickness of 0.8-2 nm by wet chemical oxidation in nitric acid at a temperature in the range of 20–130° C. or thermal oxidation in oxygen or water ambient at a temperature in the range of 800–1200° C.

17. The method according to claim 14, wherein said depositing said semiconducting layer comprises depositing a layer amorphous silicon or polysilicon having a thickness of 5-100 nm a by low pressure chemical vapour deposition (LPCVD) using $SiH_4$, $B_2H_6$, $BCl_3$ and/or $PH_3$ at a temperature in the range of 500-700° C. or by PECVD using $SiH_4$, Ar, $B_2H_6$, $BCl_3$ and/or $PH_3$ at a temperature of 200-400° C.

18. The method according to claim 9, wherein said laser doping and said metal deposition occur after said passivating.

19. The method according to claim 1, wherein said silicon based solar cell is quasi-mono-crystalline silicon containing 60-99% mono-crystalline silicon based solar cell.

* * * * *